United States Patent [19]

Andre

[11] Patent Number: 5,428,681
[45] Date of Patent: Jun. 27, 1995

[54] APPARATUS AND METHOD FOR REDUCING THE RISK OF UNDESIRABLE PARAMETER DRIFT OF AN ADAPTIVE FILTER USED FOR ECHO CANCELLATION

[75] Inventor: Tore M. Andre, Bandhagen, Sweden

[73] Assignee: Telefonaktiebolaget L M Ericsson, Stockholm, Sweden

[21] Appl. No.: 271,246

[22] Filed: Jul. 7, 1994

Related U.S. Application Data

[63] Continuation of Ser. No. 1,772, Jan. 8, 1993, abandoned.

[30] Foreign Application Priority Data

Jan. 10, 1992 [SE] Sweden .................................. 9200062

[51] Int. Cl.$^6$ .............................................. H04B 3/23
[52] U.S. Cl. ..................................... 379/406; 379/410; 379/411; 370/32.1
[58] Field of Search ............... 379/406, 410, 407, 411, 379/402, 405, 345; 370/32.1

[56] References Cited

U.S. PATENT DOCUMENTS

| | | | |
|---|---|---|---|
| 4,712,235 | 12/1987 | Jones, Jr. .............................. | 379/410 |
| 4,782,525 | 11/1988 | Sylvain et al. ................... | 370/32.1 X |
| 4,845,746 | 7/1989 | Li .................................... | 370/32.1 X |

FOREIGN PATENT DOCUMENTS

3840433A1  7/1990  Germany .

OTHER PUBLICATIONS

Patent Abstract of Japan, vol. 10, No. 192 (E-417) abstract of JP 61-035630, publ. Feb. 20, 1986. Matsushita Electric Ind. Co. Ltd.

Ding, Z. et al. *Frequency-Dependent Bursting in Adaptive Echo Cancellation and Its Prevention Using Double-Talk Detectors*. International Journal of Adaptive Control and Signal Processing, vol. 4, 219–236, 1990.

Sethares, W. et al. *Bursting in Adaptive Hybrids*. IEEE Transactions on Communications, vol. 37, No. 8, 791–799, 1989.

*Primary Examiner*—James L. Dwyer
*Assistant Examiner*—M. Shehata
*Attorney, Agent, or Firm*—Burns, Doane, Swecker & Mathis

[57] ABSTRACT

Apparatus for reducing the risk of undesirable drifting of the parameters, so-called bursting, of an adaptive echo filter which is coupled between a receiving branch and a transmitting branch included in a four-wire loop. A difference signal (E) which contains no echo from the receiving branch is generated in the transmitting branch in a known manner. The apparatus includes an adaptive predictor filter which is coupled between the transmitting branch and the receiving branch and which functions to generate a compensation signal from the difference signal (E) when transmitting narrowband signals from a near-end. The compensating signal is subtracted from a signal which appears in the receiving branch and the predictor filter is updated in a manner to minimize the correlation between the difference signal (E) and the input signal (X') of the echo filter. A relatively small predictor filter is sufficient to essentially eliminate this correlation when transmitting signals which, at maximum, consist of some few single sinusoidal tones.

16 Claims, 3 Drawing Sheets

APPARATUS AND METHOD FOR REDUCING THE RISK OF UNDESIRABLE PARAMETER DRIFT OF AN ADAPTIVE FILTER USED FOR ECHO CANCELLATION

This application is a continuation of application Ser. No. 08/001,772, filed Jan. 8, 1993 now abandoned.

BACKGROUND OF THE INVENTION

The present invention relates to an apparatus for reducing the risk of undesirable drifting of the parameters of an adaptive filter which is used for echo cancellation and which is coupled between a receiving branch and a transmitting branch of a four-wire loop, wherein a difference signal is generated in the transmitting branch by subtracting a compensation signal from the filter from a signal which is delivered to the transmitting branch via a two/four-wire hybrid.

In telephony systems in which adaptive echo cancellation is effected with the aid of an adaptive filter in a two/four-wire hybrid in a four-wire loop, so-called bursting may occur under certain operating conditions. This phenomenon occurs because the four-wire loop includes a feedback from the output of the adaptive filter to its input, via the far-end of the loop when damping is low at the far-end. When transmitting narrow-band signals from the near-end of the loop, a correlation is therefore found between the filter input signal and the difference signal formed on the output side of the filter, even when the settings of the filter parameters are good, i.e., even when the filter has converged. This correlation can cause the filter parameters to drift in a manner which will result in the self-oscillation of the four-wire loop. When bursting occurs, the loop will self-oscillate over short periods of time, while effectively cancelling echoes over longer intermediate periods. The risk of self-oscillation is particularly manifest when transmitting periodic signals, such as sinusoidal tones, since a tone is strongly correlated with itself, even after a delay. Tones are transmitted, for instance, from modems, facsimile apparatus and in conjunction with DTMF-signalling (Dual Tone Multi Frequency).

The bursting phenomenon and a method of reducing the risk of bursting are found in:

W. A. Sethares, C. R. Johnson, Jr., C. E. Rohrs: "Bursting in Adaptive Hybrids"; IEEE Transactions on Communications, Vol. 37, No. 8, Aug. 1989, pp. 791–799; and Z. Ding, C. R. Johnson, Jr., W. A. Sethares: "FREQUENCY-DEPENDENT BURSTING IN ADAPTIVE ECHO CANCELLATION AND ITS PREVENTION USING DOUBLE-TALK DETECTORS", International Journal of Adaptive Control and Signal Processing, Vol. 4, pp. 219–236.

The proposed method for reducing the risk of bursting uses a so-called doubletalk detector. A detector of this kind is intended to detect when signalling from a near-end subscriber is in progress, updating of the echo filter parameters being interrupted when such signalling is detected. It is difficult, however, to construct a reliable doubletalk detector. It has been found that even a comparatively weak signal from a near-end subscriber is able to greatly influence the setting of the echo filter and lead to self-oscillation. Furthermore, there is a risk that self-oscillation which has commenced for some reason or other can be detected as doubletalk. This would result in interruption of the updating of the filter parameters, and the self-oscillation would therefore persist, which is naturally unacceptable.

SUMMARY OF THE INVENTION

The present invention provides an apparatus and method to reduce the risk of undesirable drifting of the parameters of an adaptive filter that is used in the aforesaid manner. Accordingly, the inventive apparatus includes an adaptive filter which receives the difference signal in the transmission branch as an input signal, and which, at least in conjunction with transmitting narrow-band signals from the near-end of the loop, forms a compensation signal which is subtracted from a signal that appears in the receiving branch. The filter is updated so as to minimize the correlation between the difference signal in the transmitting branch and the input signal of the adaptive echo filter. The filter used in the apparatus may be relatively small, while still considerably reducing the risk of undesirable drifting of the echo filter parameters. A relatively small filter is namely sufficient to reduce the correlation considerably when transmitting narrow-band signals comprised, for instance, of one or more single tones, whereas when transmitting broadband signals, such as speech signals for instance, the correlation is low already at the beginning, due to the delay that occurs in the echo path via the far-end of the loop.

The invention is an apparatus and method for reducing the risk of undesirable drifting of the parameters of an adaptive filter which is used for echo cancellation and which is coupled between a receiving branch and a transmitting branch of a four-wire loop in a telephony system. A difference signal (E) is generated in the transmitting branch by subtracting a compensation signal from the filter from a signal which is delivered to the transmitting branch typically via a two/four-wire hybrid. The apparatus of the invention includes an adaptive predictor filter which is coupled between the transmitting branch and the receiving branch and which is intended to generate a second compensation signal from the difference signal (E). The apparatus also includes a means for producing a second difference signal (X') in the receiving branch by subtracting the second compensation signal from a signal which is received from a far-end of the telephony system. The apparatus further includes means for updating the parameters of the predictor filter in a manner to minimize the correlation between the difference signal (E) in the transmitting branch and the second difference signal (X').

BRIEF DESCRIPTION OF THE DRAWINGS

The present invention will now be described in more detail with reference to the drawings, in which.

DETAILED DESCRIPTION OF THE PREFERRED EMBODIMENTS

Figure 1:
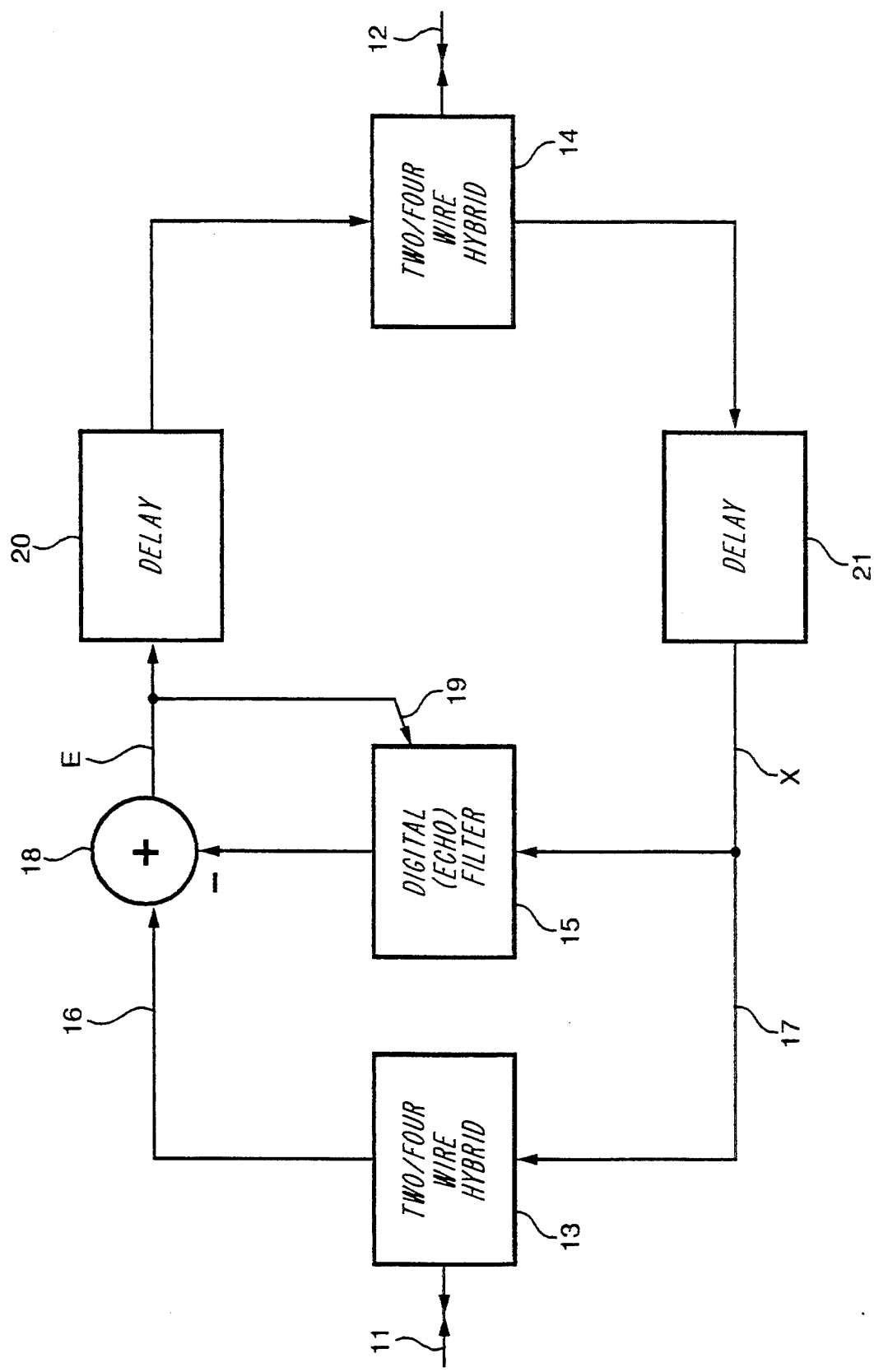
FIG. 1 illustrates an arrangement which includes a four-wire loop having a filter for adaptive echo cancellation.

FIG. 1 illustrates an arrangement which includes a conventional four-wire loop having a filter for adaptive echo cancellation. In the preferred embodiments, the filter is an adaptive digital filter. The arrangement also includes a two-wire conductor 11 at the near-end of the loop and a further two-wire conductor 12 at the far-end of the loop. Each of the cables is connected to a respective two/four-wire hybrid 13 and 14 respectively. An adaptive digital (echo) filter 15 is connected between a transmitter branch 16 and a receiver branch 17 at the hybrid 13. A compensation signal is generated by a filter input signal X'. This compensation signal constitutes an echo evaluation i.e., a "replica" of the echo to be cancelled as produced by the filter, and is subtracted in a subtraction device 18 from a signal which is delivered to the transmission branch from the near-end hybrid 13, therewith to form a difference signal E in the transmission branch. The filter parameters are updated in accordance with some known method, e.g., a least-means-square algorithm, in a manner to minimize the correlation between the filter input signal X and the difference signal E. Signal line 19 symbolizes the means by which the filter is updated.

A certain delay is always found in each transmission direction. The delays in both directions are represented in the Figure by two respective delay devices 20 and 21.

As will be evident from the aforegoing, the difference signal E may be correlated with the input signal X of the echo filter when damping in the far-end of the loop, i.e., in the hybrid 14, is poor. (Damping is poor when a significant amount of echo is received from the far-end of the loop.) This can occur even when the filter has converged, by which is meant that the settings of the filter parameters are good, i.e., the filter has converged and cancelled most of the echo in the near-end. This correlation gives rise to undesirable drifting of the filter parameters, which may result in so-called bursting. Further, tone signalling, the self-oscillation that occurs with bursting, may cause new tones to be generated, which are liable to result in erroneous information transmission.

Figure 2:
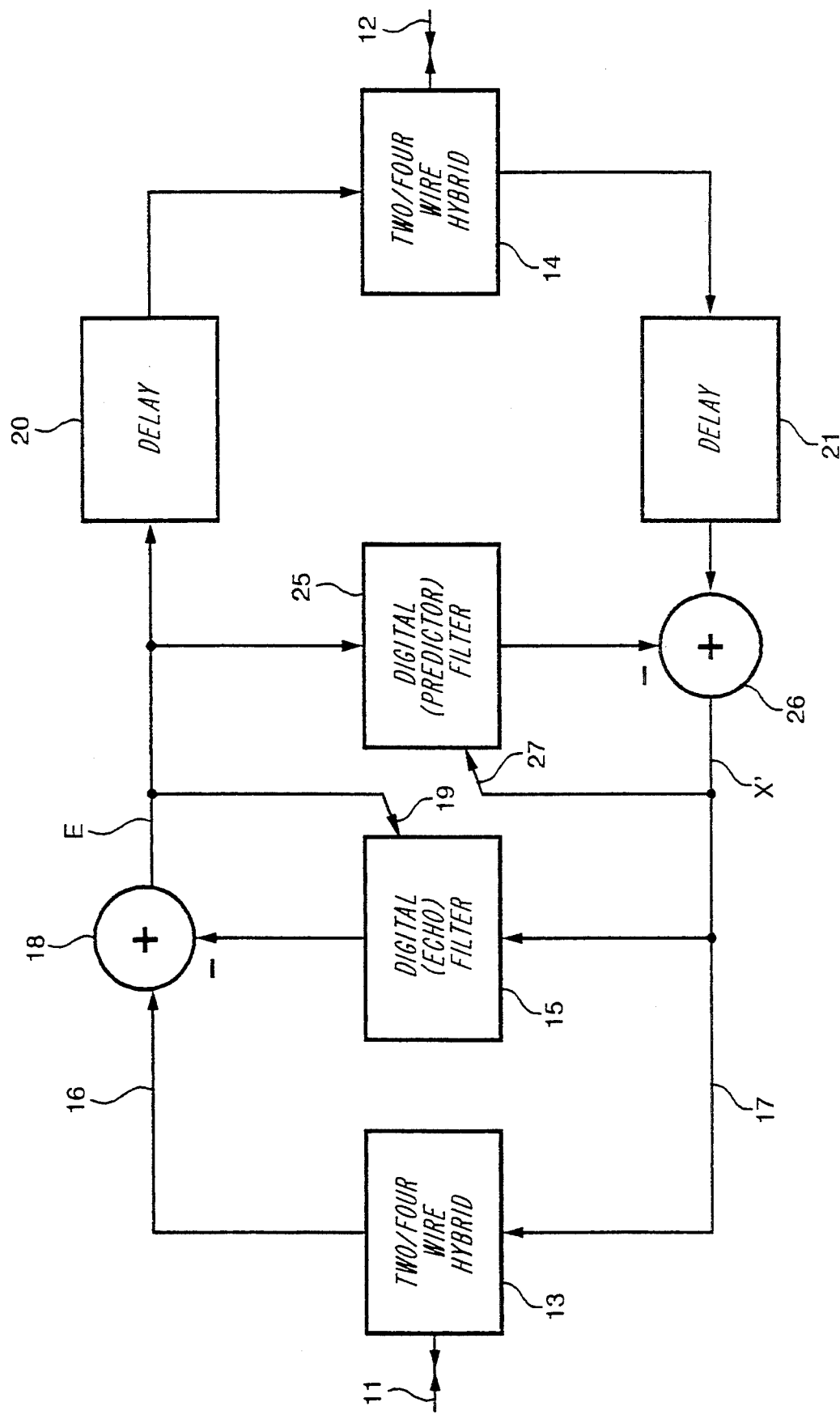
FIG. 2 illustrates an arrangement of the kind shown in FIG. 1 which is supplemented with apparatus in accordance with the invention.

FIG. 2 illustrates the arrangement according to FIG. 1 supplemented with an example of apparatus according to the invention. Those devices which are included in the FIG. 1 illustration have been identified in the FIG. 2 illustration by the same reference signs as those used earlier.

The supplementary apparatus includes an adaptive digital filter which uses a so-called predictor, predictor filter 25, and the input of which is connected to the transmission branch 16 downstream of the subtraction device 18 and which thus receives the difference signal E as an input signal. The output of the filter is connected to a minus input of a subtraction device 26 in the receiving branch 17. A difference signal X' is generated in the subtraction device 26 in the receiving branch by a signal which is received from the hybrid 14 and by a compensation signal formed in the filter. Signal line 27 symbolizes the means by which predictor filter 25 is updated.

Predictor filter 25 is updated in accordance with a known method, e.g., a least-means-square algorithm, in a manner to minimize the correlation between the input signal E of the predictor filter 25 and the difference signal X'. The size of the filter is therewith conveniently adapted to enable signals which are comprised of a limited number of sinusoidal tones of unknown phase and amplitude to be essentially cancelled out. For instance, in order to enable a signal which consists of two tones to be cancelled out, the filter requires four filter parameters, i.e., a fourth order filter is required. Such a filter enables, among other things, double tones transmitted in conjunction with so-called DTMF-signalling to be cancelled out. A filter having only two parameters, i.e., a second order filter, will suffice to cancel out single tones.

It will be noted that the input signal E of the predictor filter 25, e.g., one or two sinusoidal tones in accordance with the aforegoing, derives from a near-end signal from the two-wire conductor 11, since any echo from signals which are received from the far-end 12 will be cancelled out with the aid of the echo filter 15 and the subtraction device 18.

It will also be noted that the predictor filter 25 is connected relatively close to the echo filter 15, i.e., relatively close to the near-end hybrid 13. It will be seen from FIG. 2 that the delay devices 20 and 21, which represent the delays in the two transmission directions, are located between the predictor filter 25 and the far-end hybrid 14. It is not possible to cancel out broadband signals, such as speech signals, with a filter which is coupled in this way, since a large and unknown delay is induced in the four-wire loop, via the far-end hybrid. When transmitting broadband signals from the near-end, the value of the filter parameters is zero, meaning that the filter will then disconnect itself. However, as will be evident from the aforegoing, broadband signals need not be cancelled out, since such signals are comparatively uncorrelated with themselves after a delay. It can be mentioned by way of example, however that a speech signal which has returned as an echo has low correlation with the "continued" speech signal transmitted a moment later.

An echo canceller may be connected very close to a near-end hybrid. For instance, the echo canceller may be mounted on the same circuit board as the hybrid, this arrangement normally being referred to as an adaptive hybrid or an adaptive balance. A relatively small and simple echo filter will suffice in cases such as these, since a very small delay, at most, will occur between the hybrid and the filter. Echo cancellers may also be mounted at a much greater distance from the near-end hybrid than in the aforedescribed case, for instance in the case of long-way connections. However, the distance to the far-end hybrid is much greater than the distance to the near-end hybrid even in cases such as these. Connections which are established via a satellite are examples of such connections. When the echo canceller is distanced from the near-end hybrid, the echo filter used must be larger than would otherwise be required, because a larger delay occurs. The invention can be applied in both of these cases, i.e., irrespective of where the echo canceller is mounted.

Figure 3:
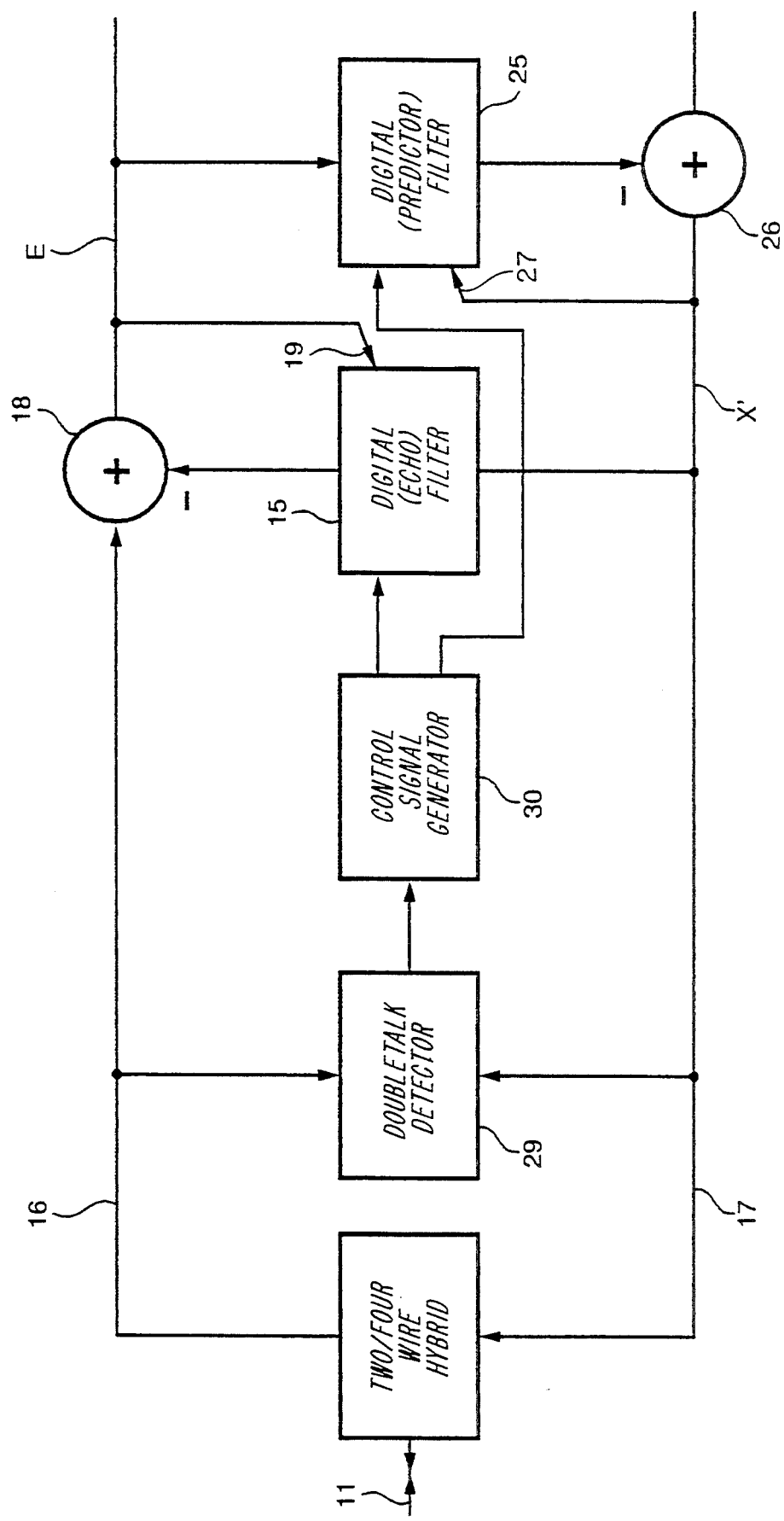
FIG. 3 illustrates a part of the arrangement shown in FIG. 2 which also includes means for further improving the effect of the inventive apparatus.

The FIG. 3 embodiment includes the arrangement illustrated in FIG. 2, only a part of said arrangement being shown, and means for further improving the effect of the inventive apparatus. These means include a doubletalk detector 29. The detector includes a level-comparing means which functions to compare the signal levels of the signal X' in the receiving branch 17 with the signal in the transmitting branch 16. Doubletalk may be defined, for instance, as existing when the signal level in the receiving branch is less than 6 dB stronger than the signal level in the transmitting branch. Naturally, doubletalk detection can be performed in other ways than that described above.

Depending on whether doubletalk is detected or not, i.e., depending on whether or not signalling is in progress from a near-end subscriber, a first or a second output signal is produced on an output of the level comparing means, i.e., the double talk detector 29. The output signal is delivered to a means 30 which generates two control signals. These control signals are delivered to the echo filter 15 and the predictor filter 25 respectively, the purposes of which are to control the speeds at which the filters are updating. This control can be effected so as not to interrupt updating of the parameters of the echo filter 15 when doubletalk is detected, since such interruption would result in a risk of self-oscillation. Instead, updating of the echo filter 15 is retarded, so that the predictor filter 25 is updated and converges more quickly than the echo filter. In those cases when a near-end signal is not detected, the updating rates of said filters is, instead, controlled so that the echo filter will be updated more quickly than the predictor filter. Changes in the filter updating rates can be effected by suitably changing the step size used in the updating process in accordance with the control signals.

It will be understood that the invention is not restricted to the described and illustrated embodiments thereof and that modifications can be made within the scope of the following Claims.

I claim:

1. A device for reducing a risk of undesirable drift of filter parameters of a first filter coupled between a receiving branch and a transmitting branch of a four-wire loop in a telephony system comprising:

said first filter being connected closer to a near-end than to a far-end of the telephony system, and having an input electrically connected to receive a signal from said receiving branch and an output to provide a first compensation signal;

means for generating a first difference signal, said first difference signal being the difference between a signal from said transmitting branch and said first compensation signal;

first two-to-four wire hybrid circuit connected between said transmitting branch and said receiving branch at the near-end of said telephony system;

a second two-to-four wire hybrid circuit connected between said transmitting branch and said receiving branch at the far-end of said telephony system;

a second filter having an input electrically connected to receive said first difference signal and an output to provide a second compensation signal wherein said second filter substantially cancels narrow-band echo signals from said second hybrid circuit and does not substantially cancel broadband echo signals from said second hybrid circuit;

means for producing a second difference signal, said second difference signal being the difference between a signal received from said far-end of the telephony system and said second compensation signal; and means for modifying filter parameters of said second filter to substantially minimize a correlation between said first difference signal and said second difference signal.

2. The device of claim 1, wherein the input to said first filter is electrically connected directly to said receiving branch.

3. The device of claim 1, wherein said first difference signal is electrically connected to allow modification of the filter parameters of said first filter to substantially minimize a correlation between said first difference signal and said signal from said receiving branch.

4. The device of claim 3 further comprising:

means for detecting a signal from a near-end telephony system user; and means for controlling rates of modification of said first and second filters to allow said first filter to be modified more slowly than said second filter when a signal from a near-end telephony system user is detected and to allow said second filter to be modified more slowly than said first filter when a signal from a near-end telephony system user is not detected.

5. The device of claim 1, wherein said second filter is configured to allow said correlation to be substantially non-existent when a transmitting branch signal from a near-end consists of a limited number of sinusoidal signals.

6. The device of claim 1, wherein said second filter is a fourth order filter to allow said correlation to be substantially non-existent when a transmitting branch signal from a near-end consists of a maximum of two sinusoidal signals.

7. The device of claim 1 further comprising:

means for detecting a signal from a near-end telephony system user;

means for modifying filter parameters of said first filter; and means for controlling rates of modification of said first and second filters to allow said first filter to be modified more slowly than said second filter when a signal from a near-end telephony system user is detected and to allow said second filter to be modified more slowly than said first filter when a signal from a near-end telephony system user is not detected.

8. The device of claim 1, wherein said first and second filters are adaptive digital filters.

9. The device of claim 1 wherein said second filter is connected closer to the near-end than to the far-end of the telephony system.

10. The device of claim 1 wherein said second filter is connected closer to the first filter than to the far-end of the telephony system.

11. The device of claim 1 wherein said second filter is electrically connected closer to said first filter and said near-end hybrid than to said far-end hybrid.

12. A method for reducing a risk of undesirable drift of filter parameters of a first filter coupled between a receiving branch and a transmitting branch of a four-wire loop in a telephony system comprising the steps of:

filtering a signal from said receiving branch through said first filter to provide a first compensation signal, wherein said first filter is electrically connected closer to a near-end than to a far-end of the telephony system;

subtracting said first compensation signal from a signal from said transmitting branch to provide a first difference signal;

filtering said first difference signal through a second filter to provide a second compensation signal wherein said second filter substantially cancels narrow-band echo signals from said far-end of said telephony system and does not substantially cancel broadband echo signals from said far-end of said telephony system;

subtracting said second compensation signal from a signal received from said far-end of the telephony system to provide a second difference signal; and modifying filter parameters of said second filter to substantially minimize a correlation between said first difference signal and said second difference signal.

13. The method of claim 12, further comprising the step of modifying filter parameters of said first filter to substantially minimize a correlation between said first difference signal and said signal from said receiving branch.

14. The method of claim 13 further comprising the steps of:
  detecting a signal from a near-end telephony system user; and
  controlling a rate of modification of said filter parameters of said first filter and a rate of modification of said filter parameters of said second filter to allow said filter parameters of said first filter to be modified more slowly than said filter parameters of said second filter when a signal from said near-end telephony system user is detected and to allow said filter parameters of said second filter to be modified more slowly than said filter parameters of said first filter when a signal from said near-end telephony system user is not detected.

15. The method of claim 12 further comprising the steps of:
  detecting a signal from a near-end telephony system user;
  modifying filter parameters of said first filter; and
  controlling a rate of modification of said filter parameters of said first filter and a rate of modification of said filter parameters of said second filter to allow said filter parameters of said first filter to be modified more slowly than said filter parameters of said second filter when a signal from said near-end telephony system user is detected and to allow said filter parameters of said second filter to be modified more slowly than said filter parameters of said first filter when a signal from said near-end telephony system user is not detected.

16. The method of claim 12 wherein said second filter is electrically connected closer to said first filter and said near-end hybrid than to said far-end hybrid.

* * * * *